United States Patent
Barnes et al.

(10) Patent No.: US 8,826,511 B2
(45) Date of Patent: Sep. 9, 2014

(54) SPACER WAFER FOR WAFER-LEVEL CAMERA AND METHOD OF MANUFACTURING SAME

(75) Inventors: George Barnes, Westminster, CO (US); Goran Rauker, Longmont, CO (US)

(73) Assignee: OmniVision Technologies, Inc., Santa Clara, CA (US)

( * ) Notice: Subject to any disclaimer, the term of this patent is extended or adjusted under 35 U.S.C. 154(b) by 392 days.

(21) Appl. No.: 13/296,901

(22) Filed: Nov. 15, 2011

(65) Prior Publication Data

US 2013/0122261 A1 May 16, 2013

(51) Int. Cl.
- *B21B 1/46* (2006.01)
- *H01L 27/146* (2006.01)
- *B32B 3/10* (2006.01)

(52) U.S. Cl.
CPC ............................... *H01L 27/14683* (2013.01)
USPC .......................................... 29/527.1; 428/172

(58) Field of Classification Search
CPC ............ B29C 43/203; B29C 67/0092; B29K 2025/04; B32B 5/00; C23C 28/00; C23C 14/28; C23C 14/048; C23C 14/30; C23C 26/02; H01L 27/14687; C04B 2235/665; H04N 5/225; B22F 2998/10; B22F 3/1055
USPC .......... 29/527.1, 418, 426.1, 426.4, 428, 458, 29/469; 428/172, 469; 427/596, 597.258; 264/401
See application file for complete search history.

(56) References Cited

U.S. PATENT DOCUMENTS

| | | | |
|---|---|---|---|
| 7,088,419 B2 | 8/2006 | Dowski, Jr. et al. | |
| 7,378,724 B2 | 5/2008 | Yu et al. | |
| 7,710,667 B2 | 5/2010 | Oliver et al. | |
| 7,876,417 B2 | 1/2011 | Dowski, Jr. et al. | |
| 2008/0008894 A1* | 1/2008 | Abdo et al. | 428/469 |
| 2008/0136956 A1 | 6/2008 | Morris et al. | |
| 2011/0181854 A1 | 7/2011 | Ovrutsky et al. | |
| 2011/0292271 A1 | 12/2011 | Lin et al. | |

FOREIGN PATENT DOCUMENTS

| | | |
|---|---|---|
| WO | 2004/027880 | 1/2004 |
| WO | 2008/020899 | 2/2008 |

OTHER PUBLICATIONS

Co-owned U.S. Appl. No. 13/293,937, filed Nov. 10, 2011.
U.S. Appl. 13/293,937 Office Action dated Feb. 6, 2014, 14 pages.
Brueck, "There Are No Fundamental Limits to Optical Lithography," SPIE Press, The International Society for Optical Engineering, vol. V. (2002) pp. 85-109.
Volkel, et al., "Miniaturized Imaging Systems, " Elsevier Science B.V., (2003) pp. 461-472.
Pitchumani, et al., "Additive Lithography for Fabrication of Diffractive Optics," Applied Optics, vol. 41, No. 29, (2002) pp. 5176-6181.

* cited by examiner

*Primary Examiner* — John C Hong
(74) *Attorney, Agent, or Firm* — Lathrop & Gage LLP

(57) ABSTRACT

A spacer wafer for a wafer-level camera and a method of manufacturing the spacer wafer include positioning a substrate in an additive manufacturing device and forming the spacer wafer over the substrate. The spacer wafer is formed by an additive manufacturing process.

14 Claims, 7 Drawing Sheets

SPACER WAFER FOR WAFER-LEVEL CAMERA AND METHOD OF MANUFACTURING SAME

BACKGROUND

This disclosure relates to wafer-level cameras, spacer wafers for wafer-level cameras and methods of manufacturing spacer wafers for wafer-level cameras, and, more particularly, to spacer wafers and methods of manufacturing spacer wafers using additive manufacturing processes.

In wafer-level cameras, spacer wafers are typically aligned with a solid substrate, such as a glass wafer, and bonded to the solid substrate using an epoxy. This is commonly done before lenses are fabricated in the solid wafer. This spacer-to-wafer bonding is difficult, since epoxy must be applied between the spacer wafer and the solid wafer, but not in or over any spacer holes. Also, an uneven bond thickness can result in variable spacer thickness.

Conventional spacer wafers for wafer-level cameras can commonly be formed of glass wafers. Spacer wafers are commonly manufactured by drilling holes through the glass wafers. The drilling process can be carried out by laser cutting, abrasive water jet cutting, sandblasting, chemical etching or other processes. Laser drilling is extremely expensive and time consuming. For example, it is not uncommon for 80 percent of the total manufacturing cost of a spacer wafer for a wafer-level camera to be in laser drilling. Laser drilling also involves long lead times. If a new array pitch or hole diameter is required, it may take weeks or longer to procure a spacer. This is especially prohibitive in rapid prototyping of lens designs and development work. Also, in conventional approaches, the possible spacer thicknesses are limited to the available standard glass wafer thicknesses.

SUMMARY

These and other drawbacks of the prior art are overcome by the present disclosure, as described herein in detail.

According to one aspect, the disclosure is directed to a method of manufacturing a spacer wafer for a wafer-level camera. The method includes positioning a substrate in an additive manufacturing device and forming the spacer wafer for the wafer-level camera over the substrate by an additive manufacturing process.

According to another aspect, the disclosure is directed to a wafer-level camera subsystem manufactured according to a method. The method includes positioning a substrate in an additive manufacturing device and forming a spacer wafer for the wafer-level camera over the substrate by an additive manufacturing process.

BRIEF DESCRIPTION OF THE DRAWINGS

The foregoing and other features and advantages of the disclosure will be apparent from the more particular description of preferred embodiments, as illustrated in the accompanying drawings, in which like reference characters refer to the same parts throughout the different views. The drawings are not necessarily to scale, emphasis instead being placed upon illustrating the principles of the disclosure.

DETAILED DESCRIPTION

According to the present disclosure, an additive manufacturing system and/or process is used to manufacture a spacer wafer for a wafer-level camera. Additive manufacturing is a process of joining or adding materials to make objects from three-dimensional (3D) model data, usually layer upon layer, as opposed to subtractive manufacturing methodologies, such as traditional machining, in which material is removed or subtracted. Since additive manufacturing most often involves forming a 3D object one layer at a time, it is sometimes referred to as "layer manufacturing."

According to the present disclosure, a spacer wafer is created directly on the substrate or glass wafer, one layer at a time. Alternatively, according to the present disclosure, a standalone spacer wafer is produced by forming the spacer wafer on a substrate formed of some sacrificial material layer, such as polypropylene or wax, using an additive manufacturing process, and then removing the sacrificial material, leaving the standalone spacer wafer.

The additive material of which the spacer wafer is formed is cured directly on the substrate, i.e., glass and/or sacrificial material layer. Therefore, no bonding or alignment is required.

Since the spacer wafer is built one layer at a time, an overall finished thickness of the spacer wafer is not limited to standard glass thicknesses. The only thickness limitation is related to the thickness of an individual additive layer. That is, in general, the overall thickness is an approximate multiple of an individual layer thickness. According to some embodiments, each additive material layer thickness is approximately 16 μm. Therefore, the overall finished thickness is generally a multiple of 16 μm. This provides greatly increased flexibility in choosing spacer thickness(es) for a wafer-level camera.

Also, many additive materials can be diamond turned (DT). Spacer wafers fabricated according to the disclosure can be diamond turned for improved flatness and finer thickness control.

Also, using an additive manufacturing process, spacer wafers can be fabricated more quickly with much shorter lead times, and much less expensively, than bonded glass spacer wafers.

In wafer-level cameras, the term "lens in a pocket (LIAP)" refers to a lens that is fabricated on a substrate such as a glass wafer in the hole of a spacer wafer after the spacer wafer has been fabricated and bonded to the substrate. The spacer wafer and the substrate are typically made of glass, and the spacer wafer is typically formed with an array or pattern of through holes, which are formed by, for example, laser drilling of the spacer wafer. The wafer and spacer wafer are aligned and bonded together using an epoxy bonding material. The array of holes is aligned such that optical elements, e.g., lenses, can be formed in the substrate within the holes in the spacer wafer.

Figure 1:
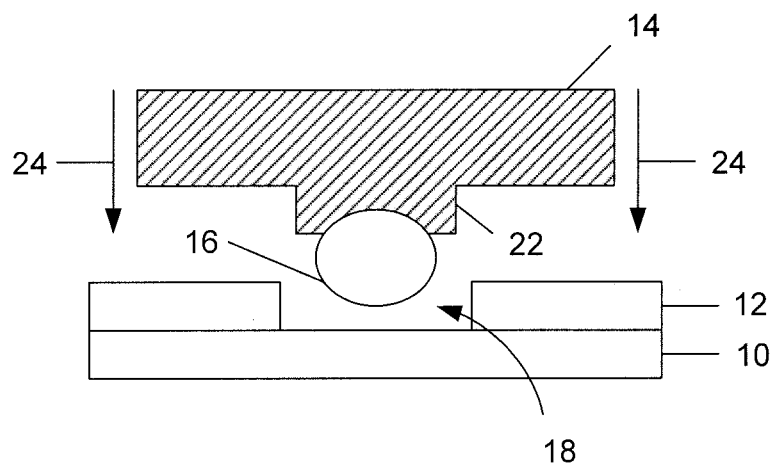
FIG. 1 contains a schematic cross-sectional diagram of fabrication of a lens in a pocket structure.

FIG. 1 contains a schematic cross-sectional diagram of the fabrication of a "lens in a pocket." Referring to FIG. 1, a wafer or substrate 10 is made of, for example, glass. A spacer wafer 12, made of a material such as, for example, glass, is bonded to wafer or substrate 10. As noted above, spacer wafer 12 can be bonded to substrate 10 by a material such as epoxy. Spacer wafer 12 forms at least one through hole 18 in which a lens 16 is to be formed. Typically, spacer wafer 12 will form an array of through holes such that a plurality of lenses 16 can be formed on substrate 10.

Lens 16 is typically formed on a top surface of substrate 10 by a tool 14, which is commonly made of polydimethylsiloxane (PDMS), which is a silicon-based polymer. Lens 16 is commonly made of an optical material such as, for example, a UV-curable lens polymer such as epoxy. The lens polymer is molded or stamped on the top surface of substrate 10 by a concave protrusion 22 of tool 14 being lowered toward the top surface of substrate 10, as indicated by arrows 24.

Figure 2:
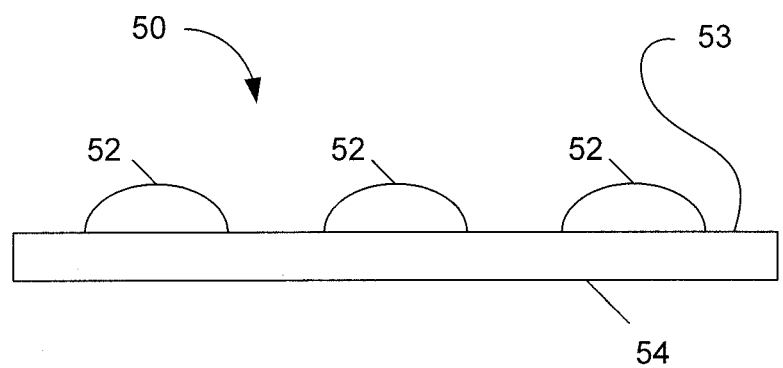
FIG. 2 contains a schematic cross-sectional diagram of a lens plate.

A lens plate is an optical structure which typically includes a substrate such as a glass wafer on which lenses have already been formed, in contrast to the lens-in-a-pocket structure described above in which lenses are formed on the substrate in holes in a spacer wafer after the spacer wafer is bonded to the substrate. The lenses may have been formed on the substrate by some known process of forming lenses, such as, for example, nanoimprint lithography via PDMS tooling, laser ablation, etc. FIG. 2 contains a schematic cross-sectional diagram of a lens plate 50. As shown in FIG. 2, a lens plate 50 includes one or more lenses 52 formed on a surface 53 of a substrate 54 such as a glass wafer. The present disclosure is applicable to the formation of a spacer wafer onto a single-sided lens plate, as illustrated in FIG. 2. As described in detail below, the disclosure is also applicable to the formation of multiple spacer wafers, e.g., two spacer wafers, on a double-sided lens plate.

Figure 3:
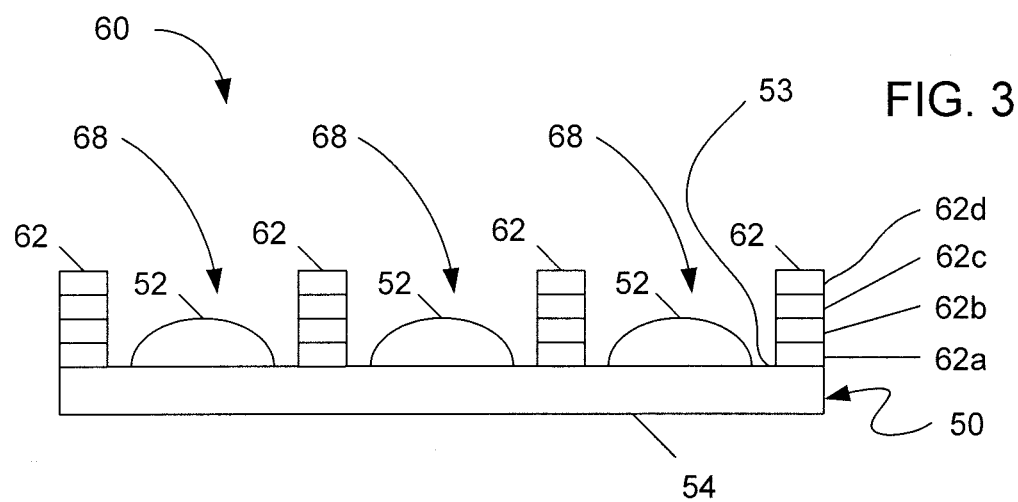
FIG. 3 contains a schematic cross-sectional diagram of a lens plate having a spacer wafer which has been additively manufactured onto the top surface of the lens plate, according to exemplary embodiments.

FIG. 3 contains a schematic cross-sectional diagram of a lens plate having a spacer wafer which has been additively manufactured onto a top surface of a lens plate, according to exemplary embodiments. Referring to FIG. 3, a device or structure 60 includes lens plate 50 (see FIG. 2) including substrate 54 with lenses 52 formed thereon. According to the disclosure, substrate 54 of lens plate 50 has served as the substrate for an additive manufacturing process used to fabricate a spacer wafer 62. Spacer wafer 62 is fabricated directly on top surface 53 of substrate 54. Spacer wafer 62 is fabricated around lenses 52 to form a pattern of through holes 68 in spacer wafer 62.

Spacer wafer 62 is built one layer at a time. For example, layer 62a is formed on top surface 53 of substrate 54. Layer 62b is formed on layer 62a, after layer 62a is formed. Layer 62c is formed on layer 62b, after layer 62b is formed. Layer 62d is formed on layer 62c, after layer 62c is formed, and so on. Layers 62a-d may not be apparent in finished spacer wafer 62.

Figure 4:
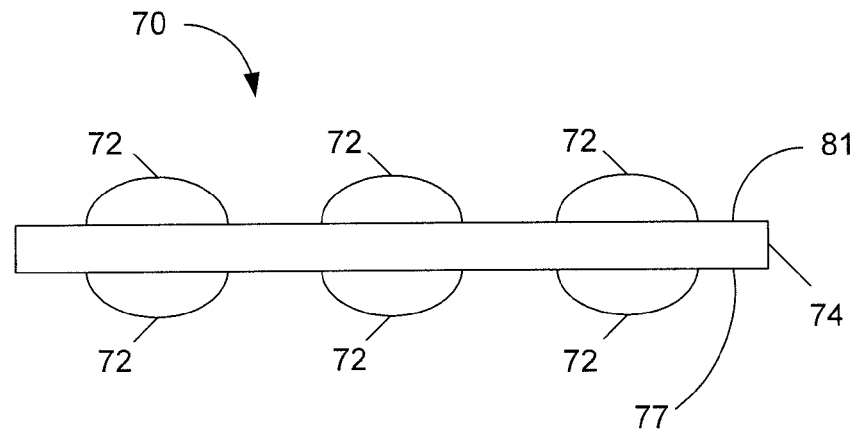
FIG. 4 contains a schematic cross-sectional diagram of a double-sided lens plate.

FIG. 4 contains a schematic cross-sectional diagram of a double-sided lens plate 70. As shown in FIG. 4, double-sided lens plate 70 can include one or more lenses 72 formed on either or both surfaces 77, 81 of a substrate 74 such as a glass wafer. As noted above, the present disclosure is applicable to the formation of spacer wafers on both sides of a double-sided lens plate 70, as illustrated in FIG. 4.

Figure 5:
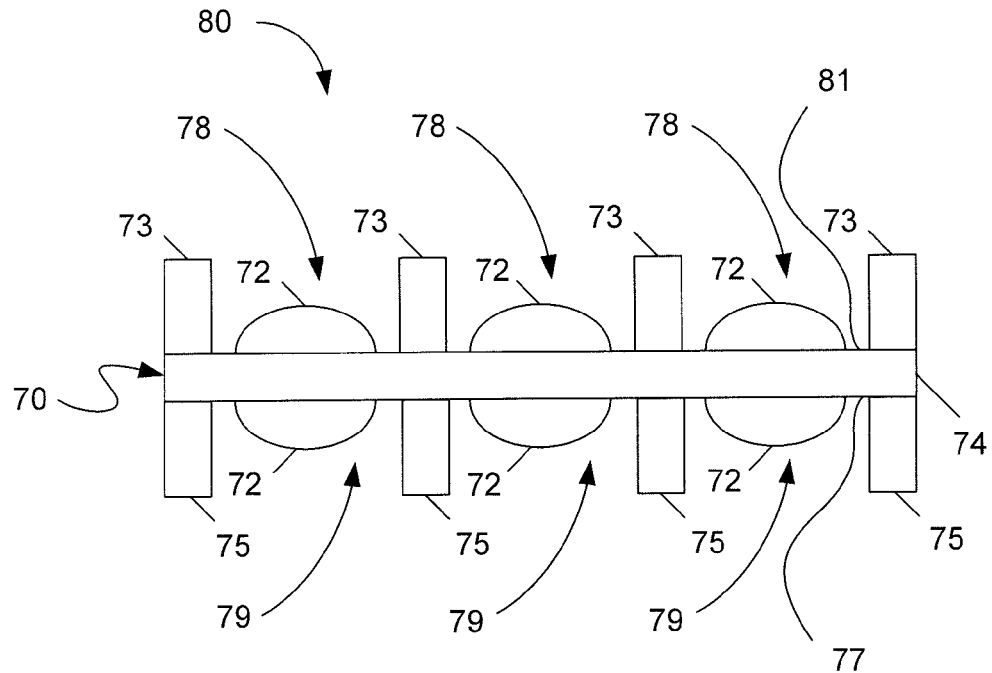
FIG. 5 contains a schematic cross-sectional diagram of a double-sided lens plate having spacer wafers which have been additively manufactured onto both the top and bottom surfaces of the lens plate, according to exemplary embodiments.

FIG. 5 contains a schematic cross-sectional diagram of a double-sided lens plate having spacer wafers which have been additively manufactured onto both top and bottom surfaces 81, 77, respectively, of lens plate 70, according to exemplary embodiments. Referring to FIG. 5, a device or structure 80 includes lens plate 70 including substrate 74 with lenses 72 formed thereon. According to the disclosure, substrate 74 of lens plate 70 has served as the substrate for an additive manufacturing process used to fabricate spacer wafers 73, 75. The additive manufacturing process can actually include two additive manufacturing processes, one for each side of lens plate 70. That is, a first additive manufacturing process can be used to form spacer wafer 73 on top surface 81 of substrate 74 of lens plate 70, and a second additive manufacturing process can be used to form spacer wafer 75 on bottom surface 77 of substrate 74 of lens plate 70. According to the present disclosure, spacer wafers 73 and 75 are fabricated around lenses 72 to form patterns of through holes 78 and 79 in spacer wafers 73 and 75, respectively.

According to the present disclosure, spacer wafers 73 and 75 are fabricated directly on top surface 81 and bottom surface 77, respectively, of substrate 74. This is in contrast to conventional approaches to double-sided lens plates with spacer wafers in which the spacer wafers are bonded to both sides of a glass substrate. In the conventional approach, to make a double-sided spacer wafer, the assembly is flipped over, and epoxy is dispensed on the glass-only side. The second spacer wafer is then aligned to the first spacer wafer in a mask aligner and bonded.

According to the disclosure, the foregoing description refers to a spacer wafer being formed directly on a substrate such as a glass wafer on which optical elements such as lenses are formed. The present disclosure is also applicable to a standalone spacer wafer, which is not necessarily formed permanently and directly onto a glass substrate. According to this aspect of the disclosure, the spacer wafer can be formed on a sacrificial material instead of the glass substrate used in the embodiments described above in detail.

Figure 6:
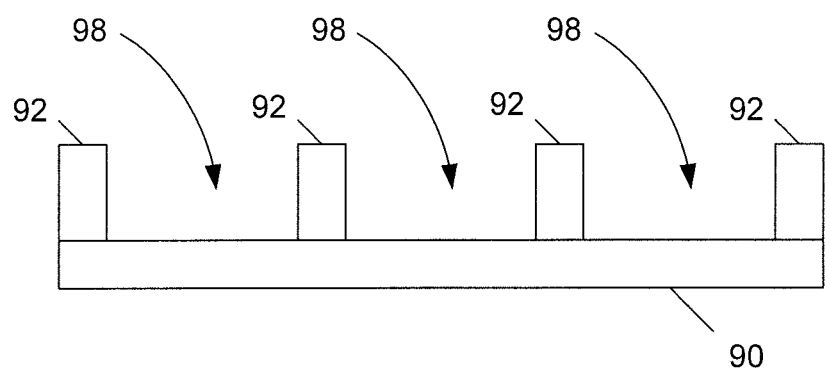
FIG. 6 is a schematic cross-sectional diagram of a spacer wafer formed by an additive manufacturing process on a sacrificial layer, according to exemplary embodiments.

FIG. 6 is a schematic cross-sectional diagram of a spacer wafer 92 formed by an additive manufacturing process on a sacrificial layer 90. As described herein, sacrificial layer 90 takes the place of the substrate or glass wafer described above. That is, in this embodiment, spacer wafer 92 is directly formed on sacrificial layer 90 in the same fashion as the spacer wafer is formed on a substrate as described above in detail. Spacer wafer 92 can form an array of through holes 98.

Figure 7:
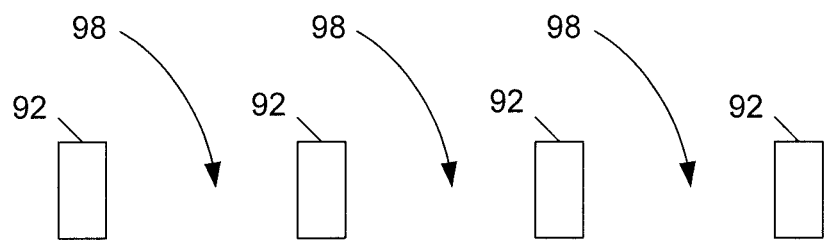
FIG. 7 is a schematic cross-sectional diagram of a standalone spacer wafer which has been removed from a sacrificial layer.

In some exemplary embodiments, sacrificial layer 90 is formed of a material which can readily be removed from spacer wafer 92. For example, sacrificial layer 90 can be formed of polypropylene or a wax support material, or other similar readily dissolved and removed support material. FIG. 7 is a schematic cross-sectional diagram of spacer wafer 92 which has been removed from sacrificial layer 90. Sacrificial layer 90 can be removed to release standalone spacer wafer 92 by isopropyl alcohol or other similar material, or by heat. Standalone spacer wafer 92 forms an array of through holes 98.

Figure 8:
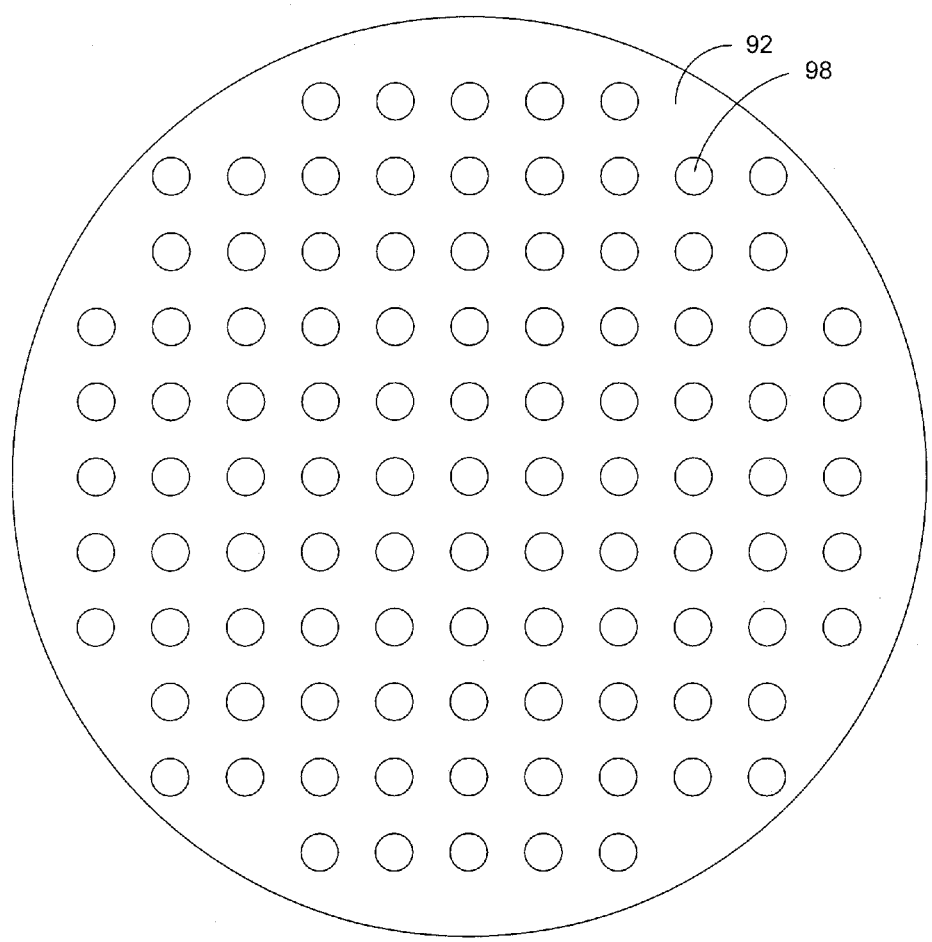
FIG. 8 is a schematic diagram of a planar view of a standalone spacer wafer manufactured by an additive manufacturing process, according to exemplary embodiments.

FIG. 8 is a schematic diagram of a planar view of standalone spacer wafer 92 manufactured by an additive manufacturing process, according to the present disclosure. As shown in FIG. 8, spacer wafer 92 forms an array of through holes 98.

The present disclosure is applicable to spacer wafers formed by any of several additive manufacturing systems and/or processes. These additive manufacturing systems and/or processes to which the disclosure is applicable include, but are not limited to, direct metal laser sintering (DMLS), which is also commonly known as selective laser sintering (SLS), fused deposition modeling (FDM), which is also commonly known as fused filament fabrication (FFF), stereolithography (SLA), and three-dimensional (3D) printing.

In general, additive manufacturing involves developing a three-dimensional model of an object to be manufactured. The 3D model includes data defining the object in three dimensions. The 3D model data are broken down by an additive manufacturing system and/or process into a vertical stack of multiple cross-sections, slices or layers. The additive manufacturing system and/or process manufactures the object by creating the layers or slices one at a time, arranged in a vertical stack. When all of the slices or layers are complete, the object has been completely fabricated.

Figure 9:
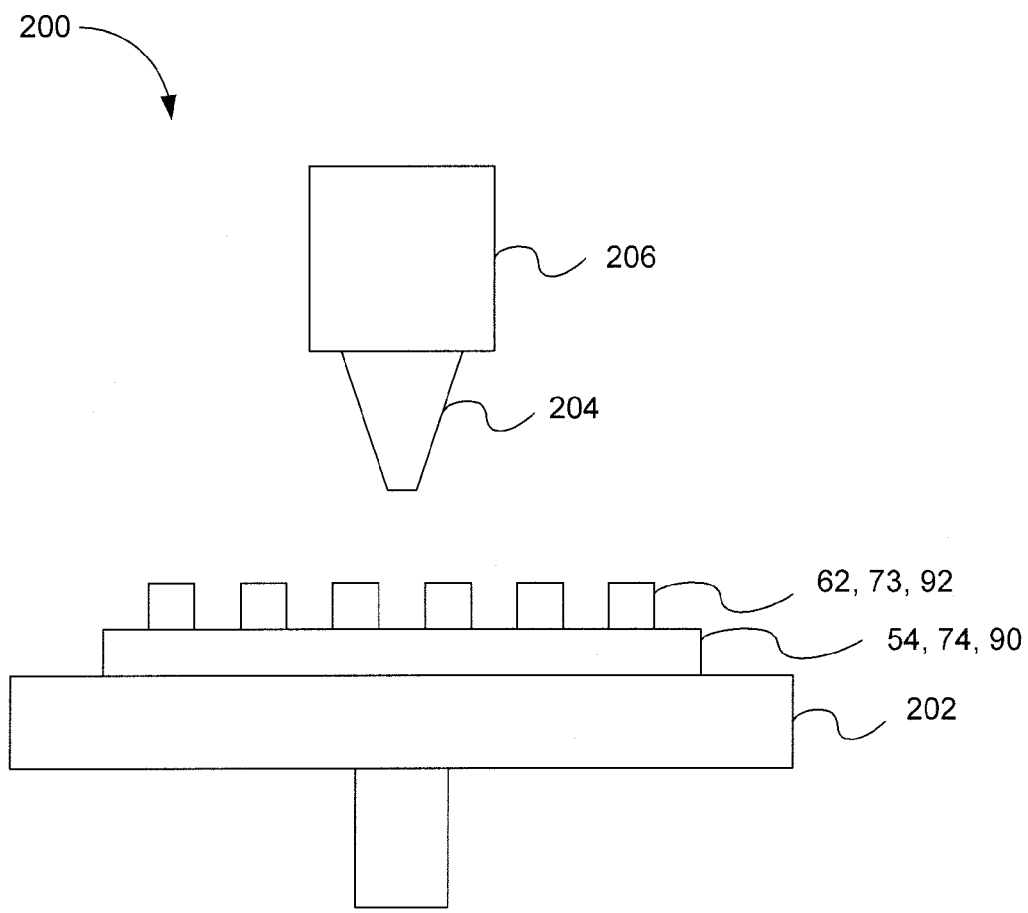
FIG. 9 is a schematic cross-sectional diagram of a fused deposition modeling (FDM) system and/or process used to additively manufacture a spacer wafer, according to exemplary embodiments.

FIG. 9 is a schematic cross-sectional diagram of a fused deposition modeling (FDM) system 200 used to additively manufacture spacer wafer 62, 73, 92, according to some exemplary embodiments. Referring to FIG. 9, FDM system 200 includes a platform 202 on which substrate 54, 74 or sacrificial layer 90, as described above in detail, can be located. According to the present disclosure, spacer wafer 62, 73, 92 described above in detail is manufactured one layer at a time by FDM system 200. FDM system 200 operates by laying down bulk material in layers. The bulk material can be, for example, a plastic filament or metal wire. The plastic filament or metal wire is unwound from a coil and supplies material to a controllable extrusion nozzle assembly, which includes an extrusion nozzle 204 and a controller and power unit 206. Nozzle 204 is heated to melt the filament or wire, and can be moved in three dimensions in horizontal, vertical, tilt and rotational directions by a numerically controlled mechanism. Spacer wafer 62, 73, 92 is fabricated by extruding small beads of the filament or wire to form layers as the plastic or metal hardens immediately after extrusion from the nozzle. In some embodiments, stepper motors or servo motors are employed to move extrusion nozzle 204 to form the vertically stacked layers. In some embodiments, platform 202 may also be controllable to move in three dimensions in horizontal, vertical, tilt and rotational directions to form the vertically stacked layers. Stepper motors or servo motors can be used to move platform 202.

Figure 10:
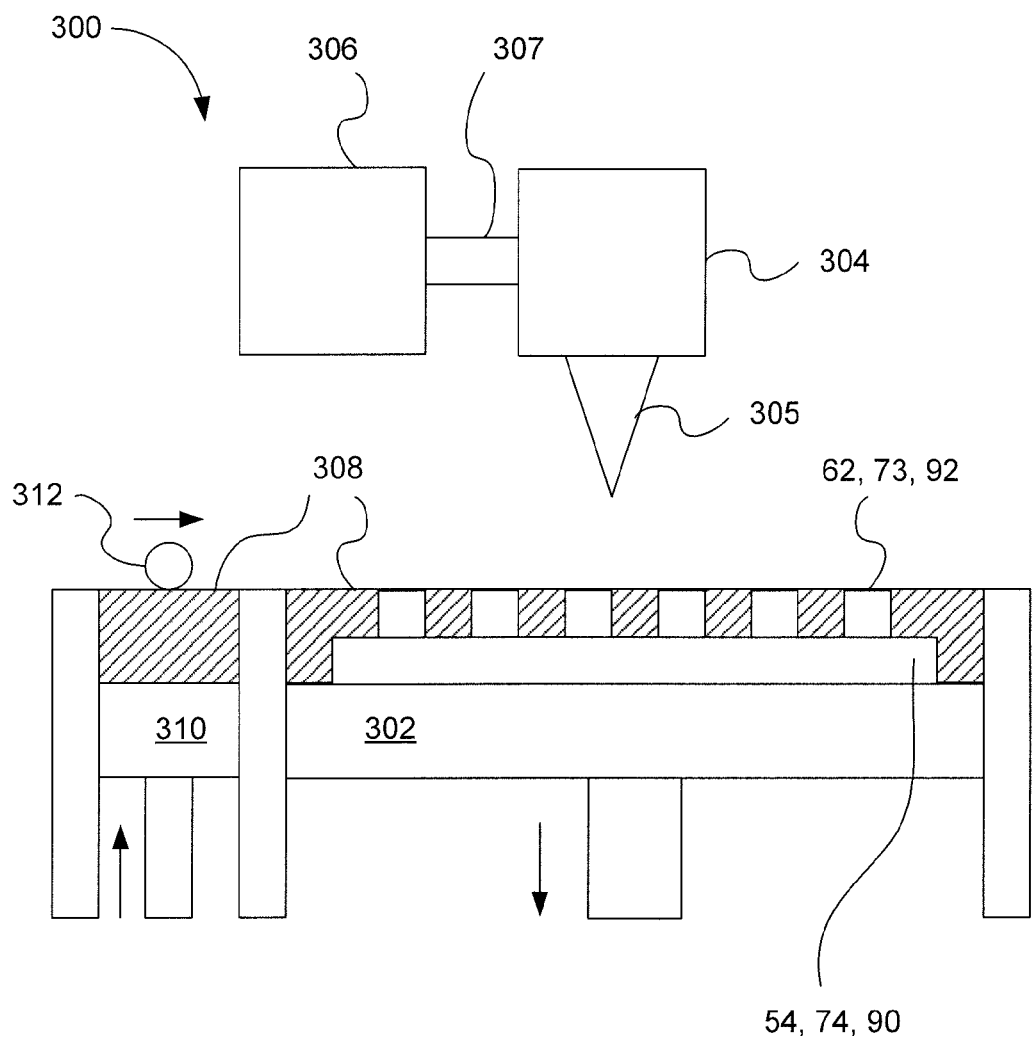
FIG. 10 is a schematic cross-sectional diagram of a selective laser sintering (SLS) and/or a direct metal laser sintering (DMLS) system and/or process used to additively manufacture a spacer wafer, according to exemplary embodiments.

FIG. 10 is a schematic cross-sectional diagram of a selective laser sintering (SLS) and/or a direct metal laser sintering (DMLS) system 300 used to additively manufacture spacer wafer 62, 73, 92, according to some exemplary embodiments. The following description refers to SLS, but it will be understood that the description is also applicable to DMLS.

Referring to FIG. 10, SLS system 300 includes a platform 302 on which substrate 54, 74 or sacrificial layer 90, as described above in detail, can be located. According to the present disclosure, spacer wafer 62, 73, 92 described above in detail is manufactured one layer at a time by SLS system 300. In general, SLS system 300 operates using a high-power laser, for example, a $CO_2$ laser, to fuse small particles of material, such as, for example, plastic, metal, ceramic, or glass powders, into a mass that has the desired 3D shape, one layer at a time. The powder 308 is contained in a powder bed on top of platform 302. A laser 306 provides laser light 307 to a scanner system 304 which scans the focused laser light 305 onto the top of powder 308. Laser light 305 selectively fuses powdered material 308 by scanning cross-sectional layers or slices generated from the 3D model, on the surface of the powder bed. After each cross-section is scanned, the powder bed is lowered by one layer thickness by platform 302, a new layer of powdered material 308 is applied from the powder reservoir by, for example a roller 312, and the process is repeated until the part is completed. A platform 310 adjusts the height of the powder reservoir to ensure that the proper amount of powder is dispensed between layers.

Figure 11:
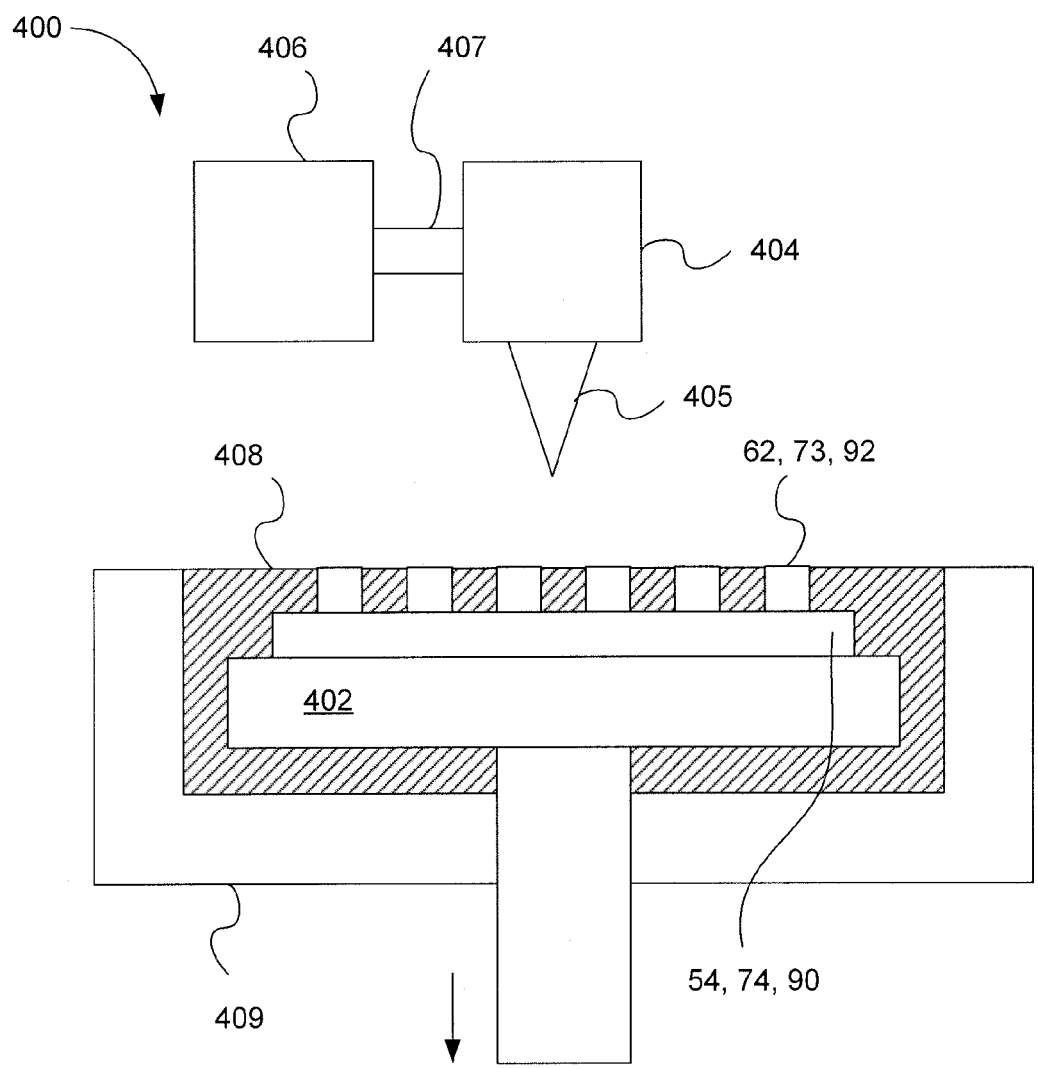
FIG. 11 is a schematic cross-sectional diagram of a stereolithography (SLA) system and/or process used to additively manufacture a spacer wafer, according to some exemplary embodiments.

FIG. 11 is a schematic cross-sectional diagram of a stereolithography (SLA) system 400 used to additively manufacture a spacer wafer, according to some exemplary embodiments. Referring to FIG. 11, SLA is an additive manufacturing process which uses a vessel 409 of liquid, curable, e.g., UV-curable, photopolymer resin 408 and a UV laser 406 and laser scanner system 404 to fabricate 3D objects, e.g., spacer wafers 62, 73, 92 of the present disclosure, one layer at a time. Laser 406 provides UV laser light 407 to scanner system 404, which scans focused laser light 405 onto the top surface of liquid resin 408. On each layer, laser beam 405 traces a cross-section or slice pattern on the surface of liquid resin 408. Exposure to UV laser light 405 cures and solidifies the pattern traced on resin 408 and effects adherence to the layer below. SLA system 400 includes a platform 402 on which substrate 54, 74 or sacrificial layer 90, as described above in detail, can be located. According to the present disclosure, spacer wafer 62, 73, 92 described above in detail is manufactured one layer at a time by SLA system 400. After a pattern has been traced, platform 402 is lowered by a layer thickness. Then, a resin-filled blade sweeps across the previously completed layer to coat it with a fresh layer of liquid resin 408 for the next layer. The next layer pattern is traced on the surface of this new liquid resin surface, adhering to the previous layer. Complete 3D spacer wafer 62, 73, 92 is formed by this process.

Three-dimensional (3D) printing is a form of additive manufacturing technology in which a 3D object is created by laying down successive layers of material. A large number of technologies are used to carry out 3D printing. Their main differences are in the way layers are built to create parts. The foregoing systems and processes, namely, FDM, SLS, DMLS, SLA, are all commonly considered to be forms of three-dimensional (3D) printing. Some 3D printing systems and methods use melting or softening material to produce the layers. Examples of this type of 3D printing include FDM, SLS and DMLS. Others lay out liquid materials that are then cured using different technologies. An example of this type of 3D printing is SLA.

Another method of 3D printing includes an inkjet printing system and method. In this approach, the printer creates the object, i.e., spacer wafer, one layer at a time by spreading a layer of powder and inkjet printing a binder in the cross-section or slice of the spacer wafer. The process is repeated until every layer is printed.

In digital light processing (DLP), a vat of liquid polymer is exposed to a 2D light pattern projected from a DLP projector under safelight conditions. The exposed liquid polymer hardens. The platform and spacer wafer are then moved down in small increments, and the liquid polymer is again exposed to light. The process repeats until the spacer wafer is fabricated.

Another approach to 3D printing includes selective fusing of print media in a granular bed. Examples of this approach are SLS and DMLS.

Resolution of additive manufacturing, e.g., 3D printing, is typically given in layer thickness and X-Y resolution in dpi. A typical layer thickness is approximately 100 µm, although some commercially available 3D printing systems can print layers as thin as 16 µm. X-Y resolution is comparable to that of presently commercially available laser printers. The particles, i.e., 3D dots, are typically approximately 50 to 100 µm in diameter.

In some exemplary embodiments, the additive manufacturing approaches of the present disclosure can be carried out using, for example, one or more of the additive manufacturing systems manufactured and sold by 3D Systems Corporation of Rock Hill, S.C., USA.

According to the present disclosure, various additive manufacturing materials can be used to fabricate spacer wafers. In one particular exemplary embodiment, the material used is Visijet® EX200 Plastic Material for 3-D Modeling, manufactured and sold by 3D Systems Corporation of Rock Hill, S.C., USA. Other materials can also be used.

According to the present disclosure, after being additively manufactured, spacer wafer 62, 73, 92, either formed on a glass substrate or a standalone spacer wafer, may be machined to a desired thickness. In some particular exemplary embodiments, the machining of spacer wafer 62, 73, 92 may be or may include diamond turning. Diamond turning is a process of mechanical machining of precision elements using lathes or derivative machine tools, e.g., turn-mills, rotary transfers, etc., equipped with natural or synthetic diamond-tipped tool bits. The term single-point diamond turning (SPDT) is also commonly used to identify the process. Using diamond turning, spacer wafer 62, 73, 92 can be faced to a desired thickness on a diamond turning lathe. In this form of diamond turning, spacer wafer 62, 73, 92 is mounted on a vacuum chuck and is rotated at some angular velocity, e.g., 1000 RPM. A cutting tool is moved across spacer wafer 62, 73, 92 to face spacer wafer 62, 73, 92 to a desired thickness. If a lower tolerance spacer wafer 62, 73, 92 is desired, the machining can be carried out by common CNC machining methods, such as facing, milling or fly cutting.

According to the present disclosure, spacer wafer 62, 73, 92 need not be machined to a single thickness. That is, spacer wafer 62, 73, 92 can be machined to various thicknesses depending on particular system requirements.

Hence, according to the disclosure, spacer wafer 62, 73, 92 can be additively manufactured and then machined to an arbitrary desired thickness. According to the disclosure, spacer wafer 62, 73, 92 can be additively manufactured on a substrate to a quantized non-uniform thickness to improve wafer-level module yield due to focus error. According to the disclosure, spacer wafer 62, 73, 92 can be additively manufactured on a substrate and then machined to an arbitrary non-uniform thickness to improve wafer-level module yield due to focus error.

It is noted that throughout this description and the drawings, through holes 68, 78, 98 formed in the various spacer wafers fabricated according to the disclosure are shown as being circular holes with straight vertical walls. This through hole configuration is exemplary only. According to the disclosure, through holes 68, 78, 98 can have any shape selected for the particular application in which spacer wafer 62, 73, 92 is to be used, in addition to or as an alternative to circular through holes 68, 78, 98. In particular, rectangular holes can be fabricated in spacer wafer 62, 73, 92 according to the disclosure. Also, tapered or otherwise non-straight-walled holes can be fabricated in spacer wafer 62, 73, 92.

According to the disclosure, spacer wafers 62, 73, 92 can be manufactured without the need for epoxy bonding to glass wafers. Therefore, the disclosure does not require the use of an epoxy dispense machine and does not require a mask aligner for the bonding step.

According to the disclosure, spacer wafers 62, 73, 92 can be additively manufactured onto an empty substrate or one with features pre-defined on it. The pre-defined features may be, for example, lenses, fiducial markings, etc.

According to the disclosure, a reduction in weight of the spacer material may be desirable to improve drop test reliability in completed wafer-level cameras. Glass densities vary from 2.4 to 2.8 g/cm$^3$, whereas a UV-curable epoxy used in 3D printers according to the disclosure may have a density of approximately 1.0 g/cm$^3$.

According to the disclosure, spacer wafers 62, 73, 92 can be manufactured to thicknesses that are multiples of the build process layer or slice thickness. For example, a layer thickness resolution available in a 3D printing system and process of the disclosure is approximately 16 µm.

The present disclosure provides arbitrary spacer wafer 62, 73, 92 thicknesses for negligible price differences. This is possible because the materials used according to the disclosure are machineable and can therefore be machined to any desired thickness for a negligible cost. Depending on the thickness tolerance of spacer wafer 62, 73, 92, traditional or diamond tooling can be used. This is an advantage over glass spacer wafers because they are currently available in 300, 400, 500, 700 and 800 µm standard thicknesses. They are also available in non-standard thicknesses, but the cost of each spacer wafer in non-standard thicknesses would be much higher. These predetermined set standard thicknesses constrain the optical design.

The present disclosure also provides spacer wafers 62, 73, 92 that are thinner than 300 µm, which cannot be manufactured using the conventional processes. The need for thinner spacer wafers has been recognized by wafer-level module optical designers to lessen the constraints on their optical designs.

The present disclosure also provides spacer wafers 62, 73, 92 having non-uniform thickness. This is advantageous since a spacer wafer with non-uniform thickness can be used to correct for focus variation that occurs across a lens plate. Measurable focus variations can occur on a lens plate because of non-uniform pressure that is applied while forming lenses, diamond tool wear while creating the master metal mold, or other process effects. These focus variations typically have low spatial frequencies across a lens plate, which can be corrected using this process.

According to the present disclosure, as described above in detail, spacer wafers 62, 73, 92 can be fabricated on both top and bottom surfaces of the substrate. To that end, after the additive manufacturing process is completed to fabricate first spacer wafer 62, 73, 92, spacer wafer 62, 73, 92 and substrate 54, 74, 90 may be removed from the additive manufacturing device, flipped over, and replaced in the additive manufacturing device. Spacer wafer 62, 73, 92 and substrate 54, 74, 90 may then be aligned, and the additive manufacturing process may be carried out again to fabricate second spacer wafer 62, 73, 92 on the opposite surface of substrate 54, 74, 90.

Combinations of Features

In any of the embodiments described in detail and/or claimed herein, the additive manufacturing process can comprise at least one of direct metal laser sintering (DMLS), selective laser sintering (SLS), fused deposition modeling (FDM), stereolithography (SLA), and three-dimensional (3D) printing.

In any of the embodiments described in detail and/or claimed herein, the substrate can be a sacrificial layer, and the method can further comprise, after forming the spacer wafer over the sacrificial layer, removing the sacrificial layer.

In any of the embodiments described in detail and/or claimed herein, the sacrificial layer can comprise polystyrene.

In any of the embodiments described in detail and/or claimed herein, the sacrificial layer can comprise wax.

In any of the embodiments described in detail and/or claimed herein, a thickness of the spacer wafer can be less than 300 μm.

In any of the embodiments described in detail and/or claimed herein, the spacer wafer can have a plurality of thicknesses.

In any of the embodiments described in detail and/or claimed herein, the method can further comprise machining the spacer wafer such that the spacer wafer has at least one desired thickness.

In any of the embodiments described in detail and/or claimed herein, the method can further comprise forming at least one element in the substrate before forming the spacer wafer.

In any of the embodiments described in detail and/or claimed herein, the at least one element can comprise a lens.

In any of the embodiments described in detail and/or claimed herein, the substrate can be formed of glass.

In any of the embodiments described in detail and/or claimed herein, the method can further comprise diamond turning the spacer wafer.

In any of the embodiments described in detail and/or claimed herein, the spacer wafer can be faulted over a first surface of the substrate, and the method can further comprises forming a second spacer wafer over a second surface of the substrate, such that first and second spacer wafers are formed over the first and second surfaces, respectively, of the substrate.

In any of the embodiments described in detail and/or claimed herein, the additive manufacturing process can comprise forming layer upon layer, one layer at a time.

While the present disclosure has shown and described exemplary embodiments, it will be understood by those of ordinary skill in the art that various changes in form and details may be made therein without departing from the spirit and scope of the present disclosure, as defined by the following claims.

We claim:

1. A method of manufacturing a spacer wafer for a wafer-level camera, comprising:
   positioning a substrate in an additive manufacturing device; and
   forming the spacer wafer for the wafer-level camera over the substrate by an additive manufacturing process.

2. The method of claim 1, wherein the additive manufacturing process comprises at least one of direct metal laser sintering (DMLS), selective laser sintering (SLS), fused deposition modeling (FDM), stereolithography (SLA), and three-dimensional (3D) printing.

3. The method of claim 1, wherein:
   the substrate is a sacrificial layer; and
   the method further comprises, after forming the spacer wafer over the sacrificial layer, removing the sacrificial layer.

4. The method of claim 3, wherein the sacrificial layer comprises polystyrene.

5. The method of claim 3, wherein the sacrificial layer comprises wax.

6. The method of claim 1, wherein a thickness of the spacer wafer is less than 300 μm.

7. The method of claim 1, wherein the spacer wafer has a plurality of thicknesses.

8. The method of claim 1, further comprising machining the spacer wafer such that the spacer wafer has at least one desired thickness.

9. The method of claim 1, further comprising forming at least one element in the substrate before forming the spacer wafer.

10. The method of claim 9, wherein the at least one element comprises a lens.

11. The method of claim 1, wherein the substrate is formed of glass.

12. The method of claim 1, further comprising diamond turning the spacer wafer.

13. The method of claim 1, wherein:
    the spacer wafer is formed over a first surface of the substrate; and
    the method further comprises forming a second spacer wafer over a second surface of the substrate, such that first and second spacer wafers are formed over the first and second surfaces, respectively, of the substrate.

14. The method of claim 1, wherein the additive manufacturing process comprises forming layer upon layer, one layer at a time.

* * * * *